United States Patent
Nakamura

(10) Patent No.: US 6,527,568 B2
(45) Date of Patent: *Mar. 4, 2003

(54) CARD CONNECTOR FOR PC CARDS

(75) Inventor: Keisuke Nakamura, Akishima (JP)

(73) Assignee: Japan Aviation Electronics Industry, Limited, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/365,284

(22) Filed: Jul. 30, 1999

(65) Prior Publication Data

US 2002/0013092 A1 Jan. 31, 2002

(30) Foreign Application Priority Data

Jul. 31, 1998 (JP) .......................................... 10-218070

(51) Int. Cl.⁷ .............................................. H01R 13/62
(52) U.S. Cl. ....................... 439/159; 439/159; 439/680; 439/160
(58) Field of Search ................................ 439/152, 153, 439/154, 155, 156, 157, 158, 159, 160, 680, 681, 567, 79

(56) References Cited

U.S. PATENT DOCUMENTS

| | | | | |
|---|---|---|---|---|
| 4,943,244 A | * | 7/1990 | Teck et al. .................. | 439/567 |
| 5,370,556 A | * | 12/1994 | Olsson ........................ | 439/681 |
| 5,683,258 A | * | 11/1997 | Tokano et al. .............. | 439/159 |
| 5,713,750 A | * | 2/1998 | Ho .............................. | 439/159 |
| 6,022,228 A | * | 2/2000 | Kuo ............................ | 439/159 |
| 6,042,402 A | * | 3/2000 | Tung et al. ................. | 439/159 |

FOREIGN PATENT DOCUMENTS

JP          10-134884          5/1998

* cited by examiner

*Primary Examiner*—P. Austin Bradley
*Assistant Examiner*—Alexander Gilman
(74) *Attorney, Agent, or Firm*—Michael Best & Friedrich; Laff Whitesel & Saret; J. Warren Whitesel

(57) ABSTRACT

A card connector comprising a U-shape frame of a pair of guide arms of synthetic resin, a metallic bridge connecting the guide arms to each other to form a U-shape, and a connector part fit to the U-shape frame beneath the metallic bridge. A lever and a slider plate of an eject mechanism are mounted on the bridge. One of the guide arms is provided with an ejector button to be slidable thereon. In order to prevent the PC card from inserting into the card connector with a state where the PC card is reversed in front and rear and/or upside down, one of the guide arms is formed with a thin polarity key and the other of the guide arms is formed with a thick polarity key. Both the guide arms are symmetrically constituted except the polarity keys and are replaceable to each other. Further the card connector is provided with ground lugs each of which has a hook for engaging with a printed circuit board and a positioning portion for positioning said card connector at a desired standoff level above the printed circuit board.

5 Claims, 8 Drawing Sheets

CARD CONNECTOR FOR PC CARDS

BACKGROUND OF THE INVENTION

This invention relates to a card connector, and in particular, to a card connector with an ejector for receiving a PC card or an IC (Integrated Circuit) card.

Generally speaking, a conventional card connector with ejector comprises a generally U-shape insulator frame consisting of a pair of guide arms extending in parallel with each other from front ends to rear ends, and an insulator bridge portion mechanically connecting the guide arms to each other at portions near their rear ends. The frame defines a card-receiving slot between the guide arms and a front open so that the card-receiving slot opens frontward. The guide arms guide a PC card inserted into the slot through the front opening. One of the guide arms has a polarity key for insuring the PC card to be inserted into the card-receiving slot with a correct position in its inserting direction and in its surface upward. That is, the polarity key prevents the PC card from being inserted into the card-receiving slot with an erroneous direction and/or with a reversed card surface upward.

The frame is usually formed into a single plastic body molded by the plastic molding process.

The bridge portion fixedly supports a set of contact elements from electrically connecting with the PC card receiving in the card-receiving slot.

Further, the eject mechanism is mounted on the frame so as to eject the PC card from a connecting state where the PC card is received in the card-receiving slot and is connected to the contact elements. The eject mechanism comprises a slide plate slidably mounted on the bridge portion, a lever pivotally mounted on the bridge portion and having an end engaging with the slide plate, and a ejector button or rod slidably mounted to one of the guide arms and having a rear end engaging with the other end of the lever. In the connecting state of the PC card, when the ejector button is pushed rearward, the lever is rotated and drives the slide plate frontward. The slide plate has claws which engage with the PC card, and therefore, the slide plate pushed the PC card frontward. As a result, the PC card is ejected from the connecting state.

The known card connector is disclosed in, for example, JP-A 10-134884.

In the recent development of portable apparatus such as note-book type personal computers, mobile telephone sets, and others, it is required that the card connector as well as other parts is reduced in size, tall, and weight.

In the known card connector structure, it is impossible to reduce the frame size because of reduction of strength accompanied. It is not desired to omit the ejector mechanism for reducing the tall of the card connector.

In the prior art, there are two ways for mounting card connector on a printed circuit board, one is usually referred to as a standard type where the card connector is mounted on an upper surface of the printed circuit, the other one is referred to as a reverse type where the card connector is mounted on a lower or reverse surface. Either the former or the latter is selected in compliance with the conditions of parts, function, etc. of apparatus. When the card connector is mounted in the lower surface of the printed circuit board, it must be turned up and down in comparison with the standard type. Accordingly, the PC card must also be turned up and down and inserted in an apparatus having the card connector mounted in the reverse type. This is troublesome for users of the apparatus containing the card connector in the standard type or the reversed type. For avoiding this problem, it is desired that the card is permitted to be always inserted in the card connector in the apparatus with its upper surface upside. To this end, there must be provided two kinds of card connectors for the standard type and for the reverse type which are different in polarity key positions. This causes high cost of the card connector because of, mainly, two different mold required.

Further, the conventional card connector is fixedly mounted on the printed circuit board by means of the hold-downs or screw-bolts. This mounting structure needs a relatively broad mounting are on the printed circuit board and is a bar for small sizing the apparatus using the card connector.

Further, the conventional card connector has a grounding lug to be connected to a ground pattern on the printed circuit board through a screw or other parts. Consequently, the grounding structure is complicated, and an electrical resistance between the grounding lug and the ground pattern is increased by presence of the screw and other parts therebetween.

In use of the card connector, there is usually remained a distance or gap between a lower surface of the card connector and a facing surface of the printed circuit board on which the card connector is mounted. The distance or gap is called "standoff". The frame is usually provided with standoff portions projecting on the lower surface of the frame. There are different requirements for the standoff in dependence on various design of the apparatus using the card connector. Therefore, there must be provided different card connectors having standoff portions of different sizes. This also increases cost of the card connector. Further, the standoff portions occupy areas on the surface of eh printed circuit board so that circuit components are limited to be mounted on the printed circuit board.

SUMMARY OF THE INVENTION

Therefore, an object of this invention is to provide a card connector for PC cards with a reduced size, especially in tall, with a reduced weight, and with a simple structure.

Another object of this invention is to provide a card connector which can commonly used for both of the standard type and the reverse type.

Still another object of this invention is to provide a card connector wherein the standoff is variable.

Other objects of this invention will become clear as the description proceeds.

In accordance with an aspect of this invention, there is provided a card connector for PC cards, which comprises: a frame comprising a pair of guide arms made of synthetic resin and a metallic bridge connecting between each end of the guide arms, and being formed generally in the U-shape to define a card-receiving slot therein; a connector part assembled in the frame beneath the metallic bridge for electrically connecting with an PC card received in the card-receiving slot; and an eject mechanism for ejecting the PC card from electrical connection with the connector part. The ejector mechanism comprises: a lever pivotally mounted on the metallic bridge; a slider plate slidably mounted on the metallic bridge an engaged with the lever; and an ejector button mounted on one of the guide arms for rotating the lever so as to slide the slider plate when pushed for ejecting the PC card.

In one aspect of the invention, the guide arms may preferably provided with polarity keys which are different each other to prevent the PC card from inserting in a position where the PC card is reversed in front and rear and/or upside down, and both of the guide arms are symmetric to each other except the polarity keys.

The polarity keys of both of the guide arms are preferably thin and thick, respectively.

In another aspect of the invention, each of the guide arms is preferably provided with a ground lug attached thereto and the ground lug has a hook-in for engaging with a printed circuit board on which the card connector is mounted.

The ground lug may preferably have a positioning portion for riding on a surface of the printed circuit board, and the hook-pin and the positioning portion have sizes corresponding to a standoff desired for the card connector.

The ground lug may further have a contact portion to be brought into contact with a ground clip of the PC card.

DESCRIPTION OF THE PREFERRED EMBODIMENTS

Figure 1:
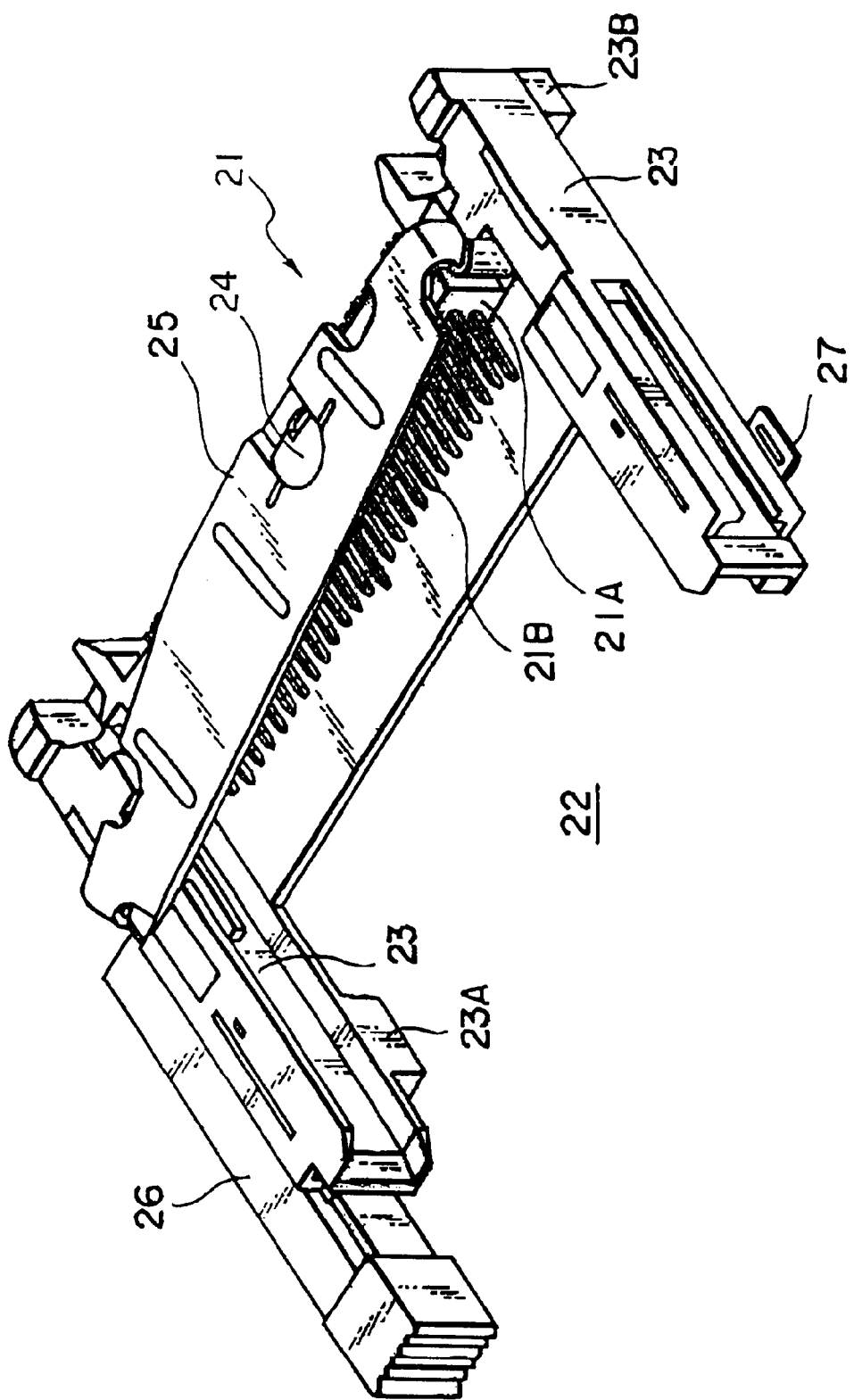
FIG. 1 is a perspective view of a conventional card connector for PC cards.

Prior to description of the preferred embodiments of this invention, a conventional card connector for PC cards will be described below referring to FIG. 1.

As shown in the figure and has been described in the preamble, the conventional card connector for PC cards comprises a U-shape insulator frame 21 which comprises a pair of guide arms 23 and a bridge portion 21A connecting the guide arms to each other. The frame 21 defines a card-receiving slot 22 between the guide arms 23. The bridge portion 21A supports a plurality of pin contacts 21B as contact elements to form an electrical connector portion for mating with the PC card received in the card-receiving slot 22.

A lever 24 is pivotally mounted by a pivot 24 on the bridge portion 21A. The lever 24 has opposite ends, one of which is engaged with a slider plate (not shown) and the other of which is engaged with a rear end of a ejector button or rod 26. The slider plate is slidably mounted on the bridge portion 21A but under the lever 25. The ejector button 26 is slidably mounted on an outer side of one of the guide arms 23. When the ejector button 26 is pushed rearward, the lever 25 is rotated to move the slider plate frontward. Therefore, the PC card is pushed frontward and is disconnected from the pin contacts 21B. That is, the lever 24, the slider plate, and the ejector button 26 make an ejector mechanism for ejecting the PC card from its connection state with the pin contacts 21B of the card connector.

The card connector has two hold-downs 27 (one of which is seen in the figure) fixed to the guide arms 23 for fixing the connector onto a printed circuit board (not shown) by use of screws, and four standoff projections two of which are shown at 23A and 23b in the figure.

The conventional card connector has problems as described in the preamble.

Referring to FIGS. 2 to 9B, the description will proceed to two card connectors for PC cards according to two preferred embodiments of this invention.

Figure 2:
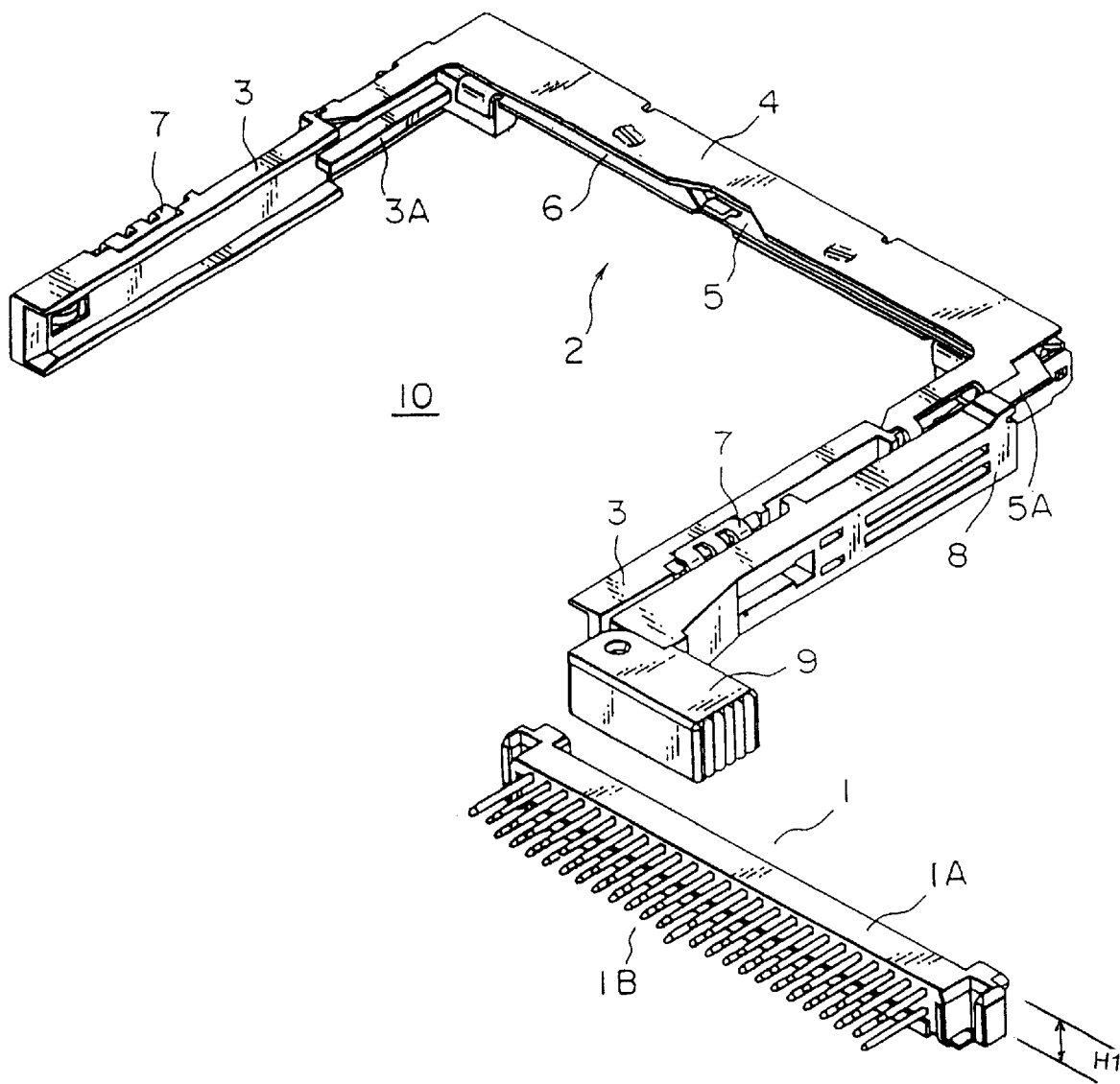
FIG. 2 is a perspective view of a relatively thin card connector for PC cards according to a first embodiment of this invention, but a connector part being disassembled.

Referring to FIG. 2, a card connector shown therein is one according to a first embodiment of this invention and has a standoff H1 of 0 mm.

The card connector of FIG. 2 is similar to the conventional one, but a connector portion 1 is formed in a separate part from a U-shape frame 2. The connector portion 1 consists of an insulator 1A and a plurality of pin contacts 1B which are fixed to the insulator 1A.

Figure 4:
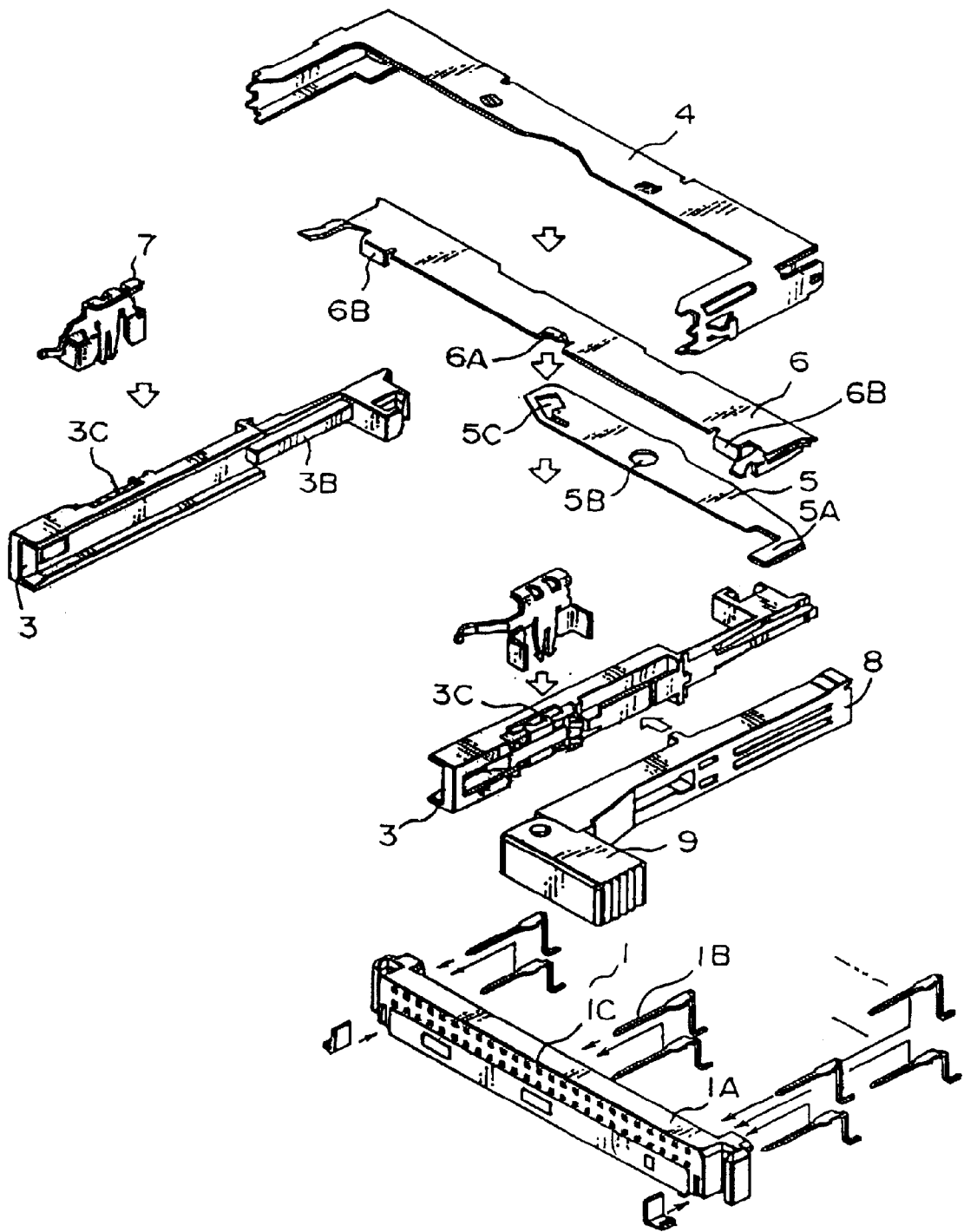
FIG. 4 is a perspective view generally illustrating a disassembled condition of each of the card connectors shown in FIG. 2 and FIG. 3.

Referring to FIG. 4 in addition to FIG. 2, the insulator body 1A of the connector portion 1 is formed with a plurality of holes 1C in which pin contacts 1B are inserted and fixed, respectively. The frame 2 comprises a pair of guide arms 3 which extend in parallel with each other from a front side to a rear side and a metallic bridge 4 which connects between rear ends of the guide arms 3 to form the U-shape. The U-shape frame 2 defines a card-receiving slot 10 between the guide arms 3. Each guide arm 3 is made of synthetic resin.

A lever 5 and a slider plate 6, which are parts of an eject mechanism, are assembled in the metallic bridge 4. The lever 5 and slider plate 6 are required a relatively high strength and are therefore made of metal.

One of the guide arms 3 is equipped with an ejector button 8 so as to be slidable. Further, the ejector button 8 has a manually operating knob 9 pivotally mounted on a front end thereof. The knob 9 is rotatable over an angular range of 90° relative to the ejector button 8.

The card connector has ground lugs 7 mounted on the outside surfaces of the guide arms 3 adjacent their front ends.

The insulator body 1A of the connector portion 1 is formed with a plurality of holes 1C in which pin contacts 1B are inserted and fixed, respectively.

In use, the connector portion 1 is at first mounted on a printed circuit board, and the frame 2 is mounted on both of the connector portion 1 and the printed circuit board in a state where the metallic bridge 4 is fit onto the connector portion 1.

Figure 3:
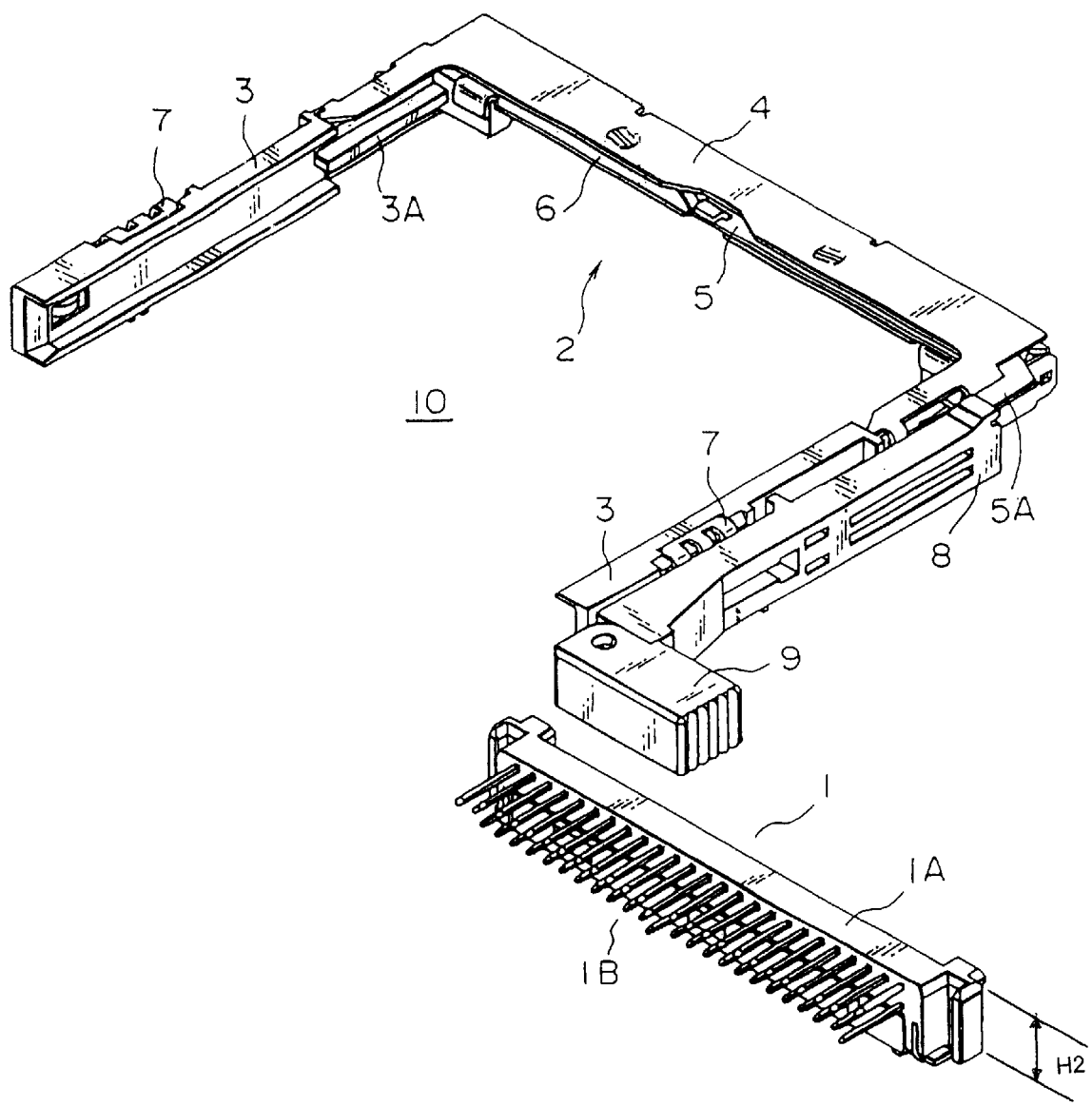
FIG. 3 is a perspective view of a relatively thick card connector for PC cards according to a second embodiment of this invention, but a connector part being disassembled.

Referring to FIG. 3 and FIG. 4, another card connector according to a second embodiment of this invention shown therein is one having a standoff H2 of 2 mm. The card connector of the second embodiment is similar to the card connector of FIG. 2 of the first embodiment except some differences. The differences are based on the difference of the standoff and are in thickness of the connector portion 21 and in the shape and size of the ground lug 7.

In either one of the card connectors of FIG. 2 and FIG. 3, when the manually operating knob 9 is pushed by a user, the ejector button 8 slides parallel to the guide arm 3 and pushes a right side end 5A of the lever 5. Thereupon, the lever 5 rotates counterclockwise because a round hole 5B thereof is fit to a pivot (not shown) mounted on the metallic bridge 4. Since a groove 5C bored in the vicinity of the left side end of the lever 5 fit to a bent projection 6A formed at the center of a side end of the slider plate 6, the slider plate 6 slides to the front side of the frame 2. As a result, claws 6B formed on a front edge at opposite end portions of the plate 6 push the PC card (not shown) frontward to eject the PC card from connection with the connector portion 1.

Figure 5A:
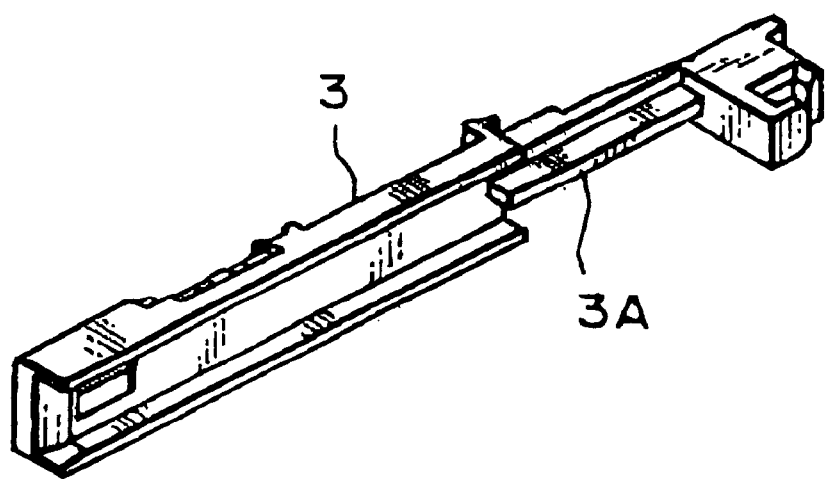
FIG. 5A is a perspective view of a guide arm which is commonly used in the card connectors of FIG. 2 and FIG. 3, the guide arm having a thin polarity key.
Figure 5B:
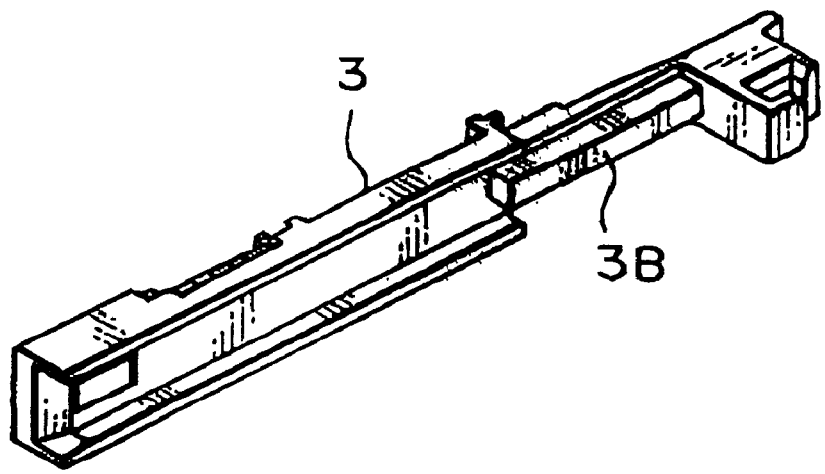
FIG. 5B is a perspective view of a guide arm which is commonly used in the card connectors of FIG. 2 and FIG. 3, the guide arm having a thick polarity key.

FIGS. 5A and 5B are perspective views of the right and left guide arms 3, respectively, which are paired and commonly used in card connectors of FIG. 2 and FIG. 3. FIG. 5A shows the guide arm 3 which is formed with a thin polarity key 3A as one body and FIG. 5B shows the guide arm 3 which is formed with a thick polarity key 3B as one body. The paired left and right guide arms 3 are formed symmetric with each other except the polarity keys 3A and 3B.

The PC card has a narrow groove ad a broad groove in both sides extending from a front end thereof in the inserting direction into the card connector, respectively, which are corresponding to the thin polarity key 3A and the thick polarity key 3B, respectively.

Consequently, the PC card can not be inserted into the card connector in the state where it is reversed in front and rear and/or upside down.

Figure 6:
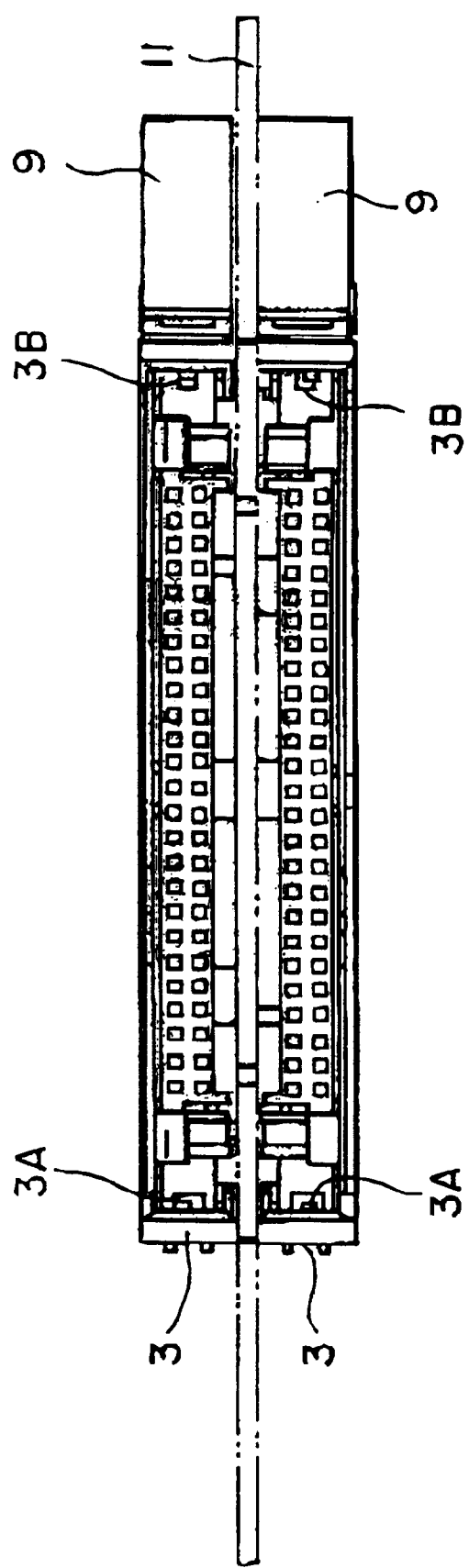
FIG. 6 is a front view showing a state when two card connectors of FIG. 2 and FIG. 3 are mounted on both sides of a printed circuit board, opposing the back sides thereof each other.

FIG. 6 is a front view showing a state where two card connectors of FIG. 2 are mounted on eh upper and lower surfaces of the printed circuit board 11. The upper card connector has a bottom surface facing the upper surface of the printed circuit board 11. In FIG. 6, the left guide arm has the thin polarity key 3A, and the right guide arm has the thick polarity key 3B.

While, the lower card connector has a bottom surface facing the lower surface of the printed circuit board 11, and therefore, the left guide arm has the thin polarity key 3A, and right guide arm has the thick polarity key 3B.

Therefore, the PC card need not be reversed upside down when it is inserted into the lower card connector, comparing with another case when the PC card is inserted into the upper card connector. The card connector can be mounted on the printed circuit board as the standard type or the reversed type, the guide arm 3 with the thin polarity key 3A and the guide arm 3 with the thick polarity key 3B are merely replaced to each other. Thus, the PC card is inserted into the card connector of the standard type or the reversed type with its upper surface reliably looking upward.

Figure 7A:
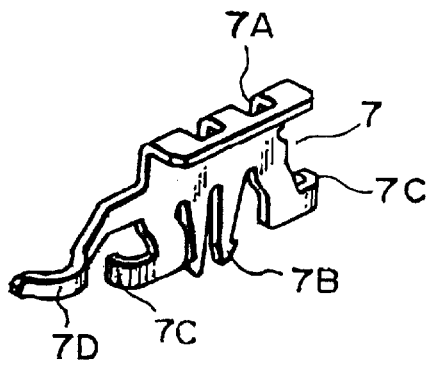
FIG. 7A is a perspective view of one of the ground lugs which is fitted to the left one of the guide arms of the card of FIG. 2.
Figure 7B:
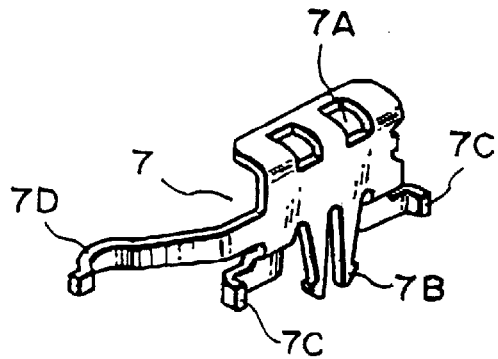
FIG. 7B is a perspective view of a right ground lug fitted to the right guide arm of the card connector of FIG. 2.

FIG. 7A and FIG. 7F shows ground lugs 7 which are mounted to the left and right guide arms of the card connector of FIG. 2 (0 mm standoff), respectively. Each of the ground lugs 7 is made of a leaf spring into one piece. The one-piece ground lug 7 has a pair of holes 7A fitting into a pair of projections 3C of the guide arm 3, a pair of hook-pins 7B for engaging with the corresponding holes in the printed circuit board 11, a pair of positioning portions 7C for riding on the surface of the printed circuit board 11, and a contact portion 7D for coming into contact with a ground clip of the PC card.

Since the hook-pins 7B and the contact portion 7D have elasticity, the card connector is easily and reliably fixedly mounted on the printed circuit board and the ground clip of the PC card is reliably connected to a ground plate region of the printed circuit board.

By changing a height of the hook-pins 78B and a height of the positioning portions 7C, the ground lug 7 is applicable to various card connectors different in the standoff.

Figure 8A:
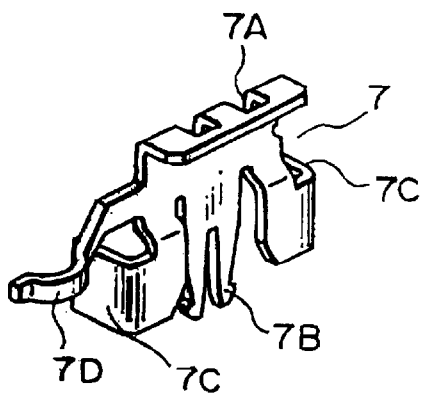
FIG. 8A is a perspective view of a left ground lug fitted a left guide arm of the card connector of FIG. 3.
Figure 8B:
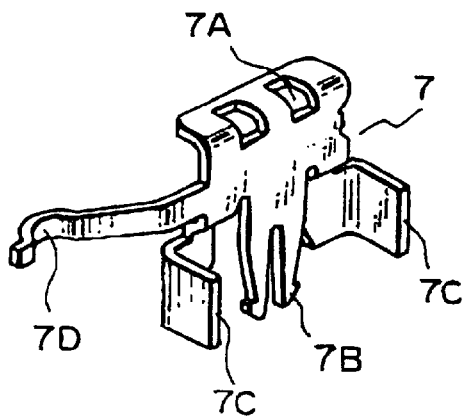
FIG. 8B is a perspective view of a right ground lug fitted to a right guide arm of the card connector of FIG. 3.

FIG. 8A and FIG. 8B show left and right ground lugs 7 which are fit to the left and right guide arms 3 of the card connector of FIG. 3 (2 mm standoff).

Figure 9A:
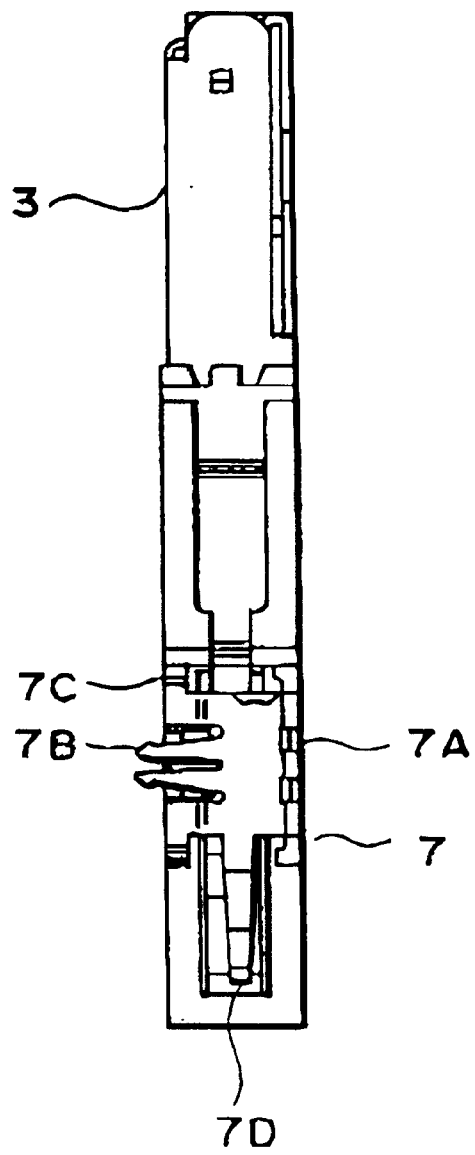
FIG. 9A is a side view of the card connector of FIG. 2.

FIG. 9A shows the card connector of FIG. 2 (0 mm standoff) where the ground lug 7 of FIG. 7A is mounted on the guide frame 3.

Figure 9B:
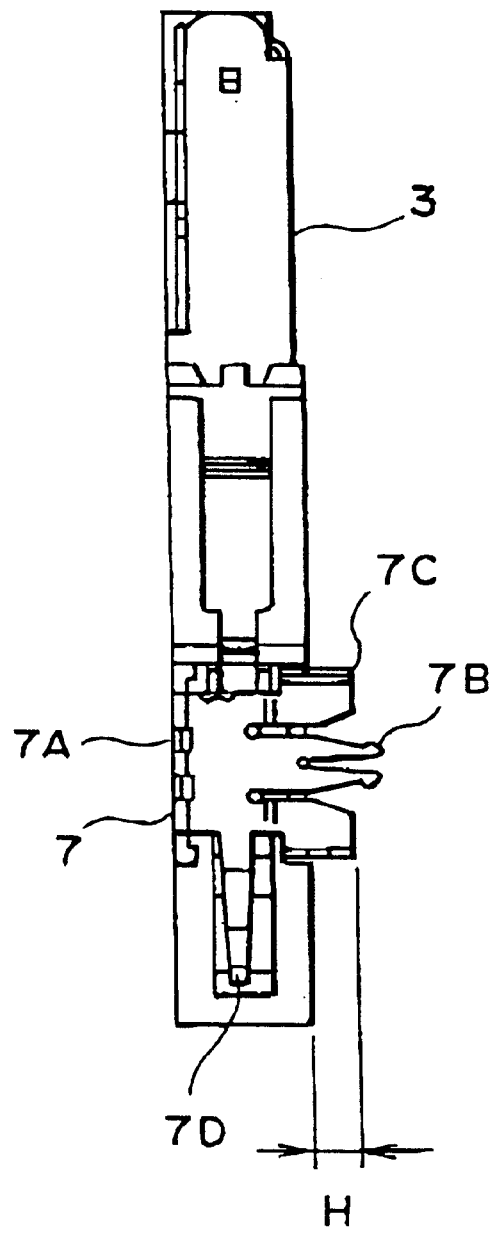
FIG. 9B is a side view of the card connector of FIG. 3.

FIG. 9B shows the card connector of FIG. 3 (2 mm standoff H) where the ground lug 7 of FIG. 8A is mounted on the guide arm.

As will be clear from the above description, this invention has the following effects.

Since the thin metallic bridge is used to connect a pair of guide arms of synthetic resin to each other to form the U-shape frame, and since the lever and slide plate of the ejector mechanism are mounted on the metallic plate, the card connector can be produced with a tall reduced.

The card connector can be used on a printed circuit board as the standard type or the reversed type only by replacing the pair of the guide arms to each other.

Since a pair of the guide arms has the same and symmetric structure except each polarity key, change of molds is little for right and left guide arms.

Since the ground lug is integral with the hook-pins which engage with the printed circuit board, the number of parts decreases. As the grounding connection is performed without use of any other parts, the card connector is profitable in practice.

The ground lug is made of a leaf spring and has elasticity and is easy to be produced with a different size of the hook-pins and the positioning portions. Therefore, the card connector is applicable to different standoff required only by replace of the ground lugs having different sizes.

Since the card connector is fixed to the printed circuit board by means of the hook-pins of a pair of the ground lugs, mounted area for other circuit components on the printed circuit board increases.

What is claimed is:

1. A card connector for PC cards, comprising:
   a frame comprising a pair of guide arms made of synthetic resin and a metallic bridge connecting between each end of said guide arms, and being formed generally in a U-shape to define a card-receiving slot therein;
   said guide arms having polarity keys which are different from each other in order to prevent a PC card from being inserted in a position where the PC card is reversed front to rear and/or inserted upside down, and both of said guide arms being symmetric with respect to each other except for said polarity keys, said keys configured respectively as thin and thick plates extending in a mating direction,
   further one of said guide arms having one of said polarity keys and the other of said guide arms having another of said polarity keys, said guide arms being replaceable for each other, a connector part assembled in said frame beneath the metallic bridge for electrically making a connection with a PC card received in said card-receiving slots; and an eject mechanism for ejecting said PC card from electrical connection with said connector part, said ejector mechanism comprising:

a level pivotally mounted on said metallic bridge;

a slider plate slidably mounted on the metallic bridge an engaged with said level; and an ejector button mounted on one of said guide arms for rotating said level so as to slide said slider plate when pushed for ejecting the PCV card.

2. A card connector as claimed in claim of claim 1, wherein each of said guide arms is provided with a ground lug attached thereto and said ground lug has a hook-pin for engaging with a printed circuit board on which said card connector is mounted.

3. A card connector for PC cards as claimed in claim 2, wherein said ground lug is made of a leaf spring.

4. A card connector for PC cards as claimed in claim 3, wherein said ground lug has a positioning portion for riding on a surface of said printed circuit board, and said hook-pin and said positioning portion have sizes corresponding to a standoff desired for the card connector.

5. A card connector for PC cards as claimed in claim 4, wherein said ground lug has a contact portion to be brought into a contact with a ground clip of the PC card.

* * * * *